(12) United States Patent
Ipek et al.

(10) Patent No.: US 6,549,082 B2
(45) Date of Patent: Apr. 15, 2003

(54) HIGH FREQUENCY OSCILLATOR

(75) Inventors: Mehmet Ipek, Villingen-Schwenningen (DE); Martin Rieger, Rottweil (DE); Heinrich Schemmann, Villingen-Schwenningen (DE)

(73) Assignee: Thomson Licensing S.A., Boulogne (FR)

(*) Notice: Subject to any disclaimer, the term of this patent is extended or adjusted under 35 U.S.C. 154(b) by 0 days.

(21) Appl. No.: 09/887,458

(22) Filed: Jun. 22, 2001

(65) Prior Publication Data

US 2002/0011902 A1 Jan. 31, 2002

(30) Foreign Application Priority Data

Jun. 28, 2000 (EP) .............................. 00113629

(51) Int. Cl.[7] ................................. H03L 7/00
(52) U.S. Cl. ........................ 331/57; 331/18; 327/148; 327/149
(58) Field of Search ................. 331/57, 16, 47, 331/48, 51, 54; 327/154, 155, 156, 157, 158, 159, 147, 148

(56) References Cited

U.S. PATENT DOCUMENTS

| | | | |
|---|---|---|---|
| 5,570,066 A | | 10/1996 | Eberhardt et al. ............ 331/34 |
| 5,635,879 A | * | 6/1997 | Sutardja et al. ............... 331/57 |
| 5,889,437 A | | 3/1999 | Lee ............................... 331/16 |
| 6,081,164 A | | 6/2000 | Shigemori et al. ............ 331/16 |
| 6,377,788 B1 | * | 4/2002 | Elder et al. .................. 455/266 |

OTHER PUBLICATIONS

Mehmet Soyuer et al. "A fully monolithic 1.25GHz CMOS Frequency Synthesizer", Symposium on VLSI Circuits, US, NY, IEEE, Jun. 9, 1994 pp 127–128. XP000501055.

Buchwald et al. "A 6–GHz Integrated Phase–Locked Loop Using AlGaAS/GaAs Heterojunction Bipolar Transistors" IEEE Journal of Solid–State Circuits, US, IEEE vol. 27, No. 12, Dec. 1, 1992, pp. 1752–1762, XP000329025.

Novof et al. "Fully integrated CMOS phase–locked loop with 15 to 240 MHZ locking range and 50 ps jitter", IEEE Journal of solid–state circuits, IEEE, vol. 30, No. 11, Nov. 1, 1995, pp. 1259–1266, XP000553064.

* cited by examiner

Primary Examiner—Tuan T. Lam
Assistant Examiner—Hiep Nguyen
(74) Attorney, Agent, or Firm—Joseph S. Tripoli; Kuniyuki Akiyama

(57) ABSTRACT

The high frequency oscillator comprises a reference oscillator, a phase-locked loop circuit with a phase frequency detector, a charge pump, a ring oscillator and a divider, the reference oscillator being coupled to the phase frequency detector for frequency control. The ring oscillator is a symmetrical delay cell oscillator containing two amplifiers with a dual output stage for providing I/Q output signal generation. The reference oscillator works in the range of 1.25–1.5 GHz and is a Colpitts type digital controlled frequency synthesizer with an external tank circuit for providing a low phase noise, and the dividing factor of the divider is four for providing a tuned output range of 5 to 6 GHz. The phase-locked loop circuit is integrated together with the reference oscillator into an integrated circuit, using advantageously a BICMOS Silicon/Germanium process, which is well suited for RF applications.

5 Claims, 4 Drawing Sheets

HIGH FREQUENCY OSCILLATOR

BACKGROUND

The present invention relates to a high frequency oscillator comprising a phase-locked loop (PLL), providing a tuned frequency range in the 5 to 6 GHz band.

Today, there are various activities to establish new wireless services in the 5 to 6 GHz band, e. g. European Hyperlan2 and IEEE 802.11a in the United States. As a consequence, a high demand for integrated oscillators and I/Q generation circuits exists, comprising a good phase noise.

High frequency oscillators using a phase-locked loop are well known in literature, for example from "Theorie und Anwendungen des Phase-Locked Loops", Roland Best, in "Der Elektroniker, No. 6/1975. A high frequency oscillator with a phase-locked loop comprising a phase frequency detector, a charge pump with a filter, a voltage control oscillator and a divider, the high frequency oscillator being controlled by a reference frequency, is known from Mehmet Soyuer et al.: "A FULLY MONOLITHIC 1.25 GHZ CMOS FREQUENCY SYNTHESIZER" Symposium on VLSI Circuits, US, New York, IEEE, Jun. 9, 1994, pages 127–128, ISBN: 0-7803-1919-2, also from Buchwald et al.: "A 6 GHZ INTEGRATED PHASE-LOCKED LOOP USING ALGAAS/GAAS HETEROJUNCTION BIPOLAR TRANSISTORS", IEEE Journal of Solid State Circuits, US, IEEE Inc. New York, Vol. 27, No. 12, 01.12.1992, pages 1752–1762, XP000329025, and Novof et al.: "Fully integrated CMOS phase-locked loop with 15 to 240 MHz locking range and 50 ps jitter", IEEE Journal of Solid State Circuits, US, IEEE Inc New York, Vol. 30, No. 11, 01.11.1995, pages 1259–1266, XP000553064. A further reference, relating to a fully integrated oscillator in the GHz range and to a ring oscillator, is Pottbaecker and Langmann: "AN 8 GHZ SILICON BIPOLAR CLOCK-RECOVERY AND DATA-REGENERATOR IC", IEEE Journal of Solid-State Circuits, IEEE, December 1994, Vol. 29, pp. 1572–1576.

The object of the present invention is therefore to provide a high frequency oscillator with a good phase noise in the 5 to 6 GHz band, which allows especially a cost effective integration on an IC.

SUMMARY OF THE INVENTION

The high frequency oscillator of the invention comprises a reference oscillator and a phase-locked loop circuit with a phase frequency detector, a charge pump, a ring oscillator and a divider, the reference oscillator being coupled to the phase frequency detector for frequency control. The reference oscillator works advantageously in the range of 1.25–1.5 GHz and is a Colpitts type digital controlled frequency synthesizer with an external tank circuit for providing low phase noise, and the dividing factor of the divider is four for providing a tuned output range of 5 to 6 GHz. The ring oscillator is a symmetrical delay cell oscillator containing two delay cell amplifiers, which provide advantageously ground-free I/Q output signals, having a very low phase noise due to the phase-locked loop.

The phase-locked loop circuit is integrated together with the reference oscillator into an integrated circuit, using advantageously a BICMOS Silicon/Germanium process, which is well suited for RF applications. The tank circuit of the reference oscillator and the loop filter of the charge pump are external to the integrated circuit. Advantageous embodiments, especially relating to the charge pump and to the ring oscillator, are set up in the subclaims and are explained in the further description.

BRIEF DESCRIPTION OF THE DRAWINGS

The invention is now explained below by way of an embodiment with reference to schematic drawings, which show.

DETAILED DESCRIPTION OF THE PREFERRED EMBODIMENT

Figure 1:
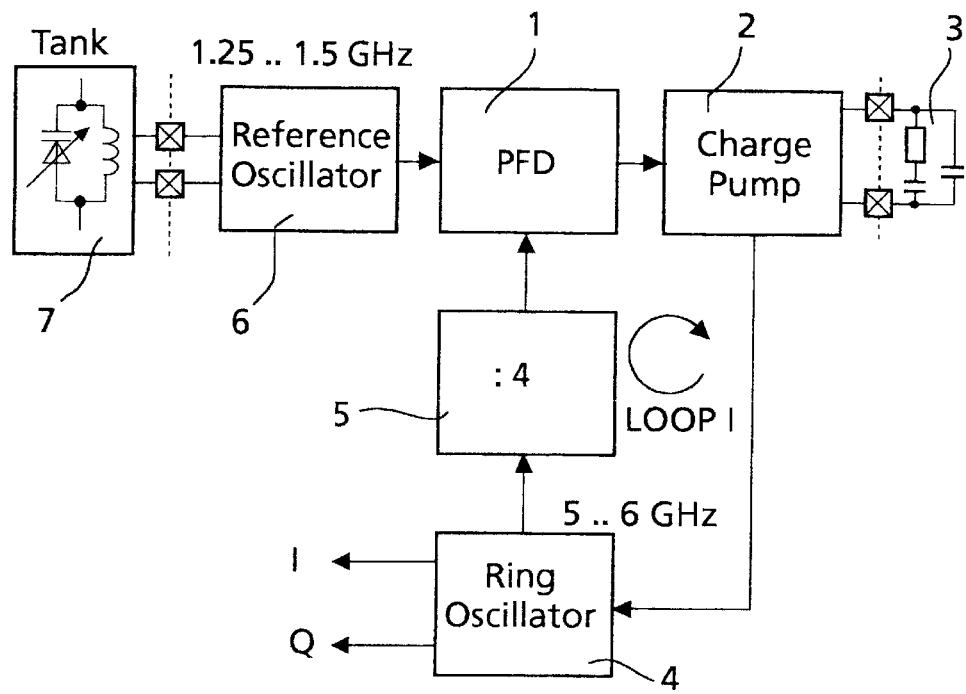
FIG. 1 a high frequency oscillator for the 5 to 6 GHz range.

As shown in FIG. 1, a reference oscillator 6 with a tuning circuitry, an external tank circuit 7, is used as a VCO for providing a reference frequency with a good phase noise. To cover a local oscillator (LO) range from 5 to 6 GHz, a small tuning range from 1.25 to 1.5 GHz is preferably used for the reference oscillator 6. This is achievable with an external LC-tank 7 of reasonably high Q.

The reference frequency of the reference oscillator 6 is applied to a phase-frequency detector 1, operating from 1.25 to 1.5 GHz, of a phase-locked loop (PLL) circuit, which comprises further a charge pump 2 with a loop filter 3, a ring oscillator 4 (DCO, delay cell oscillator) and a divider 5. The PFD (phase-frequency detector) 1 compares phase and frequency of the DCO 4 against the reference oscillator 6. The PFD output is filtered by the loop filter 3 of the charge pump 2 and applied to the DCO 4 for frequency control.

For the charge pump 2 and the loop filter 3, a fully differential architecture is used to avoid disturbances on the tuning control voltage. If the loop bandwidth is high, the loop reaction to phase changes is very fast, therefore phase noise is reduced. The DCO frequency is divided by four by the divider 5, before it is applied to the PFD 1. For this reason, the phase noise performance of the PLL-controlled DCO is worse than that of the reference source 6, in theory, by 12 dB.

The phase-frequency-detector 1 consists of two D-Flipflops (DFF) and an AND-gate for the RESET path. ECL-structures are used and optimized to operate up to 1.8 GHz. As the reference source an integrated Colpitts type oscillator with an external LC-tank 7 is used for the reference oscillator 6. The divider by four 5 is realized with ECL-Flipflops and optimized in terms of speed and current consumption.

The delay cell oscillator 4 (DCO) and the charge pump 2 will be explained now in more detail with regard to FIG. 2 and FIG. 3.

Figure 2:
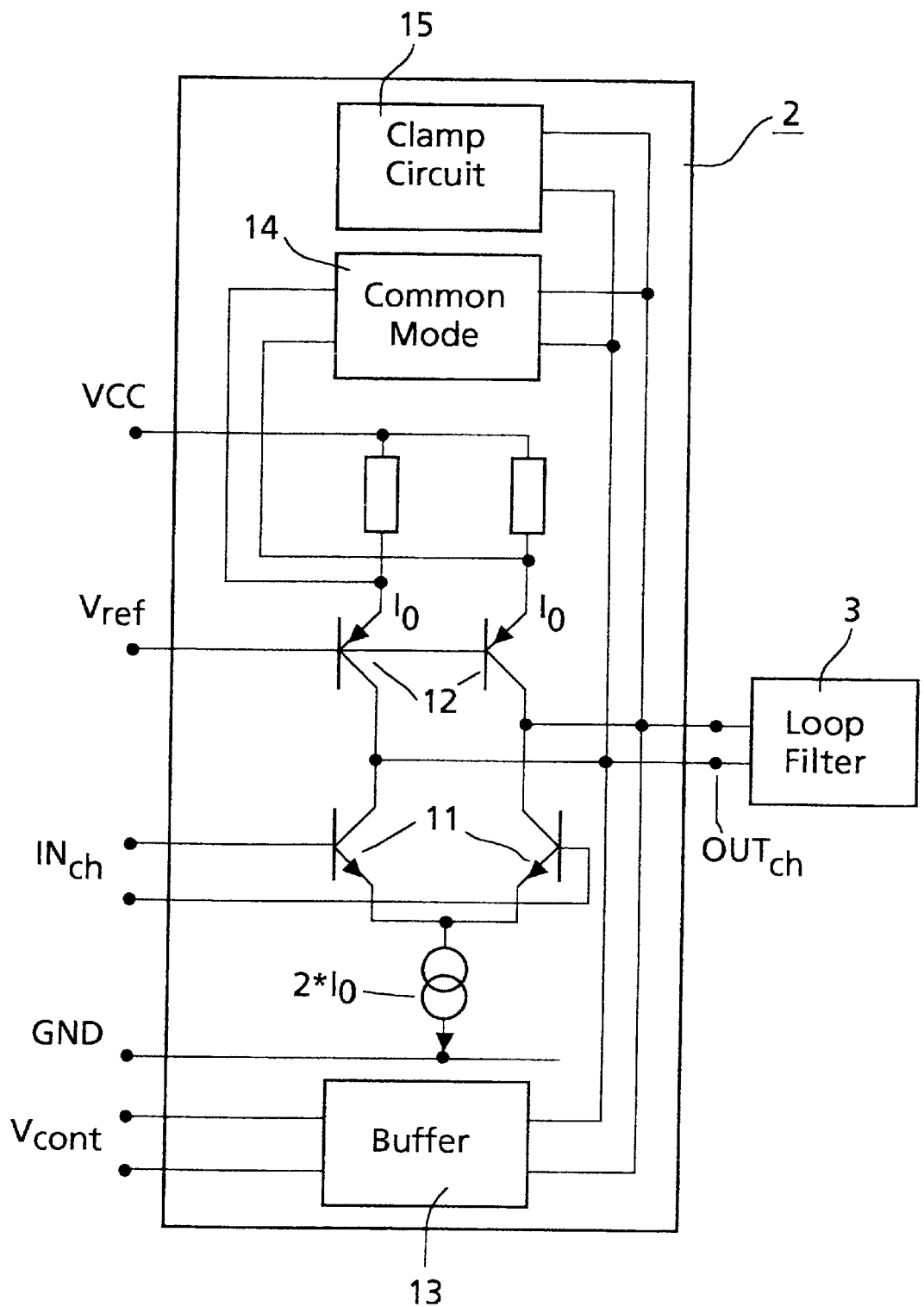
FIG. 2 the charge pump of the high frequency oscillator of FIG. 1.

The charge pump 2 according to FIG. 2 has a wide bandwidth, only limited by the pin-pad-interface to the external loop filter 3 and the loop filter 3 itself. This is achieved by an architecture that uses only npn-transistors in the signal path, not requiring fast pnp or pMOS transistors. A first current source, pnp transistors 12, feed a constant current $I_0$, which is controlled by $V_{ref}$, to the collectors of the npn-transistor pair 11. At the input $IN_{ch}$ of the npn transistor pair 11, the output signal of the PFD 1 is applied. The emitters of the transistor pair 11 are coupled via a second current source, $2*I_0$, to ground GND. At the output $OUT_{ch}$ the difference of $\pm 2 \times I_0 - I_0$ flows to the external loop filter 3. The signal at the loop filter 3 is sensed by a buffer 13 and forwarded as an output control voltage $V_{cont}$ to the control input of the DCO 4.

To keep the output nodes in the proper operating range, a common mode amplifier 14 controls the average current of the pnp-transistors 12 to be exactly half of the current of the npn-transistors 11. A clamp circuit 15 ensures that the control signal of the DCO 4 is inside the allowed limits. The loop filter 3 is connected differentially to avoid distortions and crosstalk on the tuning line; there is no ground path for the loop filter 3. This is necessary for a steep tuning characteristic of the DCO 4.

Figure 3:
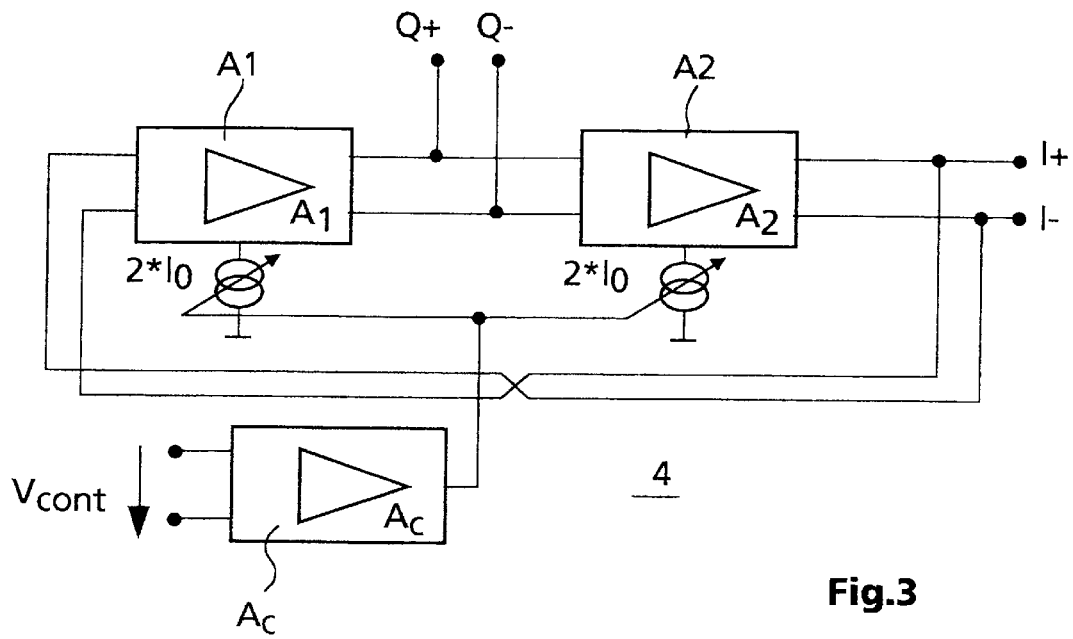
FIG. 3 the ring oscillator of the high frequency oscillator of FIG. 1.

The voltage controlled DCO 4, as shown in FIG. 3, is built up of two amplifiers $A_1$ and $A_2$, and forms a symmetrical ring oscillator. The voltage $V_{cont}$ from the charge pump 2, FIG. 2, controls the tail current $2I_0$ for the amplifiers A1, A2 via a control amplifier $A_c$, see also FIG. 6. The delay of the amplifiers A1 and A2 is nearly linear depending on the current $2I_0$, enabling a rather linear characteristic of the frequency tuning. The current output of the amplifiers A1, A2 causes a voltage drop across load resistors $R_c$, see FIG. 6, resulting in a small-signal gain of about $$\frac{I_0 \cdot R_c}{V_T}.$$

By implementing the differential architecture completely on a chip (integrated circuit), RF interference effects, like LO leakage, can be minimized. This is a requirement for modern direct conversion receiver concepts. The principle of the circuit is well suited for fully integrated oscillators in the multi-GHz range and offers a very wide tuning range.

The phase noise of ring oscillators has been modelled in many studies, see for example in references A. Hajimiri, S. Limotyrakis and T. H. Lee, "Jitter and Phase Noise in Ring Oscillators", *IEEE Journal of Solid-State Circuits*, IEEE, June 1999, Vol. 34, pp. 790–804 [1], and B. Razavi, "A Study of Phase Noise in CMOS Oscillators", *IEEE Journal of Solid-State Circuits*, IEEE, March 196, Vol. 31, pp. 331–343 [2]. The calculation of phase noise in this work follows the comprehensive work of reference Hajimiri, A. and T. H. Lee, "The Design of *Low Noise Oscillators*", Kluwer Academic Publishers, Norwell, Mass., USA, 1999 [3].

If we apply the calculations of the single-sideband phase noise of [3] to a bipolar differential ring oscillator 4 as depicted in FIG. 3, we obtain the equation $$L(\Delta f) = 10\log\left(\frac{N}{3} \cdot \frac{f_0^2}{\Delta f^2} \cdot \left(\frac{e}{I_0} + \frac{4kT}{R_c \cdot I_0^2}\right)\right). \quad \text{(Eq. 1)}$$

In this equation, N is the number of delay stages, $f_0$ is the oscillation frequency and $\Delta_f$ is the frequency offset, where the phase noise is measured. As the noise sources, the collector current shot noise and the noise of the load resistor are taken into consideration, while the noise of the base resistance and the 1/f-noise are neglected. From Eq. 1 it is understood, that the tail current $I_0$ and the voltage swing $R_c \cdot I_0$ should be made large, which stands in contradiction to a low power design. A further conclusion from Eq. 1 is, to take only a minimum number of delay stages.

If we evaluate Eq. 1 with N=2, $I_0$=400 $\mu$A, $R_c$=400 $\Omega$, $f_0$=6 GHz and $\Delta f$=10 kHz, we obtain as phase noise L(10 kHz)=−41 dBc/Hz. That means for systems with higher order modulation methods like QAM, this oscillator has to be controlled by a wideband PLL with a reference oscillator of respectively low phase noise.

Therefore, the phase noise performance of the delay cell oscillator 4 does not satisfy the needs of modern digital transmission systems. When controlled within a PLL, the reference oscillator 6 governs the phase noise of the VCO inside the loop bandwidth. The phase noise $S_{\phi o}$ of the PLL-output as a function of the frequency offset $\Delta f$ may be expressed therefore as $$S_{\Phi 0}(\Delta f) = S_{\Phi DCO}(\Delta f) \cdot \left(\frac{1}{1+G(\Delta f) \cdot H(\Delta f)}\right)^2 + \quad \text{(Eq. 2)}$$

$$S_{\Phi ref}(\Delta f) \cdot \left(\frac{G(s)}{1+G(\Delta f) \cdot H(\Delta f)}\right)^2.$$

In Eq. 2, $S_{\phi DCO}$ is the phase noise of the DCO as calculated in accordance with Eq. 1, $S_{\phi ref}$ is the phase noise of the reference oscillator 6, $G(\Delta f)$ is the forward loop gain and $H(\Delta f)$ stands for the reverse loop gain.

As the reference oscillator 6 inhibits a tank circuit 7 of resonance frequency $f_{0ref}$ and quality factor $Q_{ref}$, noise figure $F_{ref}$ and output power $P_{ref}$, its phase noise $S_{\phi ref}$ may be expressed according to Leesons formula as $$S_{\Phi ref}(\Delta f) = \frac{1}{2}\left(1 + \frac{1}{4 \cdot Q_{ref}^2} \cdot \left(\frac{\omega_{0ref}}{\Delta f}\right)^2\right) \frac{F_{ref}kT}{P_{ref}}. \quad \text{(Eq. 3)}$$

The forward loop gain $G(\Delta f)$ depends according $$G(\Delta f) = K_\Phi \cdot Z_L(\Delta f) \frac{K_{VCO}}{\Delta f} \quad \text{(Eq. 4)}$$

on the phase detector and charge pump constant $K_\phi$, on the impedance $Z_L$ of the loop filter 3 and on the tuning constant $K_{VCO}$ of the VCO 4.

The reverse loop gain $H(\Delta f)$ may be expressed as $$H(\Delta f) = \frac{1}{N} \quad \text{(Eq. 5)}$$

as a function of the divider ratio N.

Inserting Eq. 4 to Eq. 6 in Eq. 3, the phase noise of the PLL circuit 1–5 can be calculated. For a realistic embodiment, the calculation is based on the assumptions:

6. DCO phase noise as calculated in section 3.1 for $f_{DCO}$=6 GHz
7. DCO tuning constant $K_\phi$=1000 $2\pi$ MHz/V
8. Phase detector constant $K_\Phi$=0.5 mA/($2\pi$ rad)
9. Divider factor N=4
10. Loop filter $Z_L$ with $C_1$=0, $C_2$=22 pF, $R_2$=15 k$\Omega$
11. Reference oscillator $Q_{ref}$=20, $f_{0ref}$=1.5 GHz, $F_{ref}$=3, $P_{ref}$=0.2 mW As a result, the PLL is able to improve the phase noise, at e.g. 10 kHz offset frequency, from −41 dBc/Hz (free running VCO) to −78 dBc/Hz (VCO is PLL controlled). However, towards lower frequencies the phase noise increases, as the phase noise of the reference oscillator 6 increases. The choice of the loop filter 3 is critical, in that it influences the resonance at the characteristic frequency of the PLL. To achieve a good phase noise performance, the low-noise-reference oscillator 6 has to operate also on a high-Q-resonator with $Q_{ref}$>20 and the bandwidth of the loop PLL should be >20 MHz.

According to measurements, the DCO frequency may be tuned from 3.5 GHz up to 6 GHz. The phase noise performance is limited by the reference oscillator 6. Using an external reference with L(10 kHz)=−104 dBc/Hz at 1.25 GHz operating frequency, the measured phase noise is −90 dBc/Hz at 5 GHz overall. This is 2 dB worse than the expected theoretical 12 dB reduction in phase noise between reference and DCO.

Figure 4:
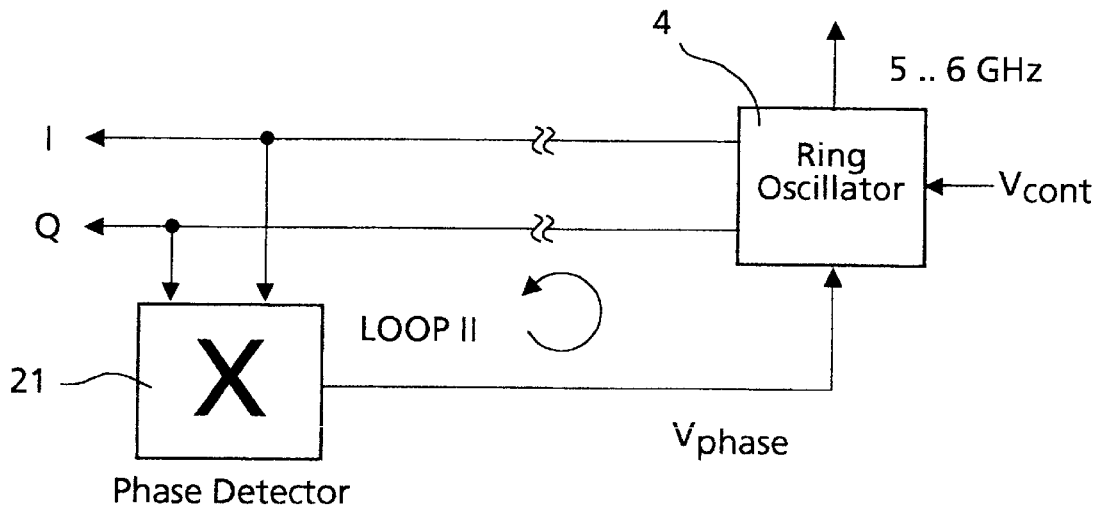
FIG. 4 the ring oscillator according to FIG. 1, comprising a loop with a phase detector.

The high frequency oscillator may comprise also a second loop with a phase detector 21 coupled to the I/Q output signals of the ring oscillator 4, as shown in FIG. 4. The phase detector 21 provides an error signal $V_{phase}$ for the ring oscillator 4, when the phase difference between the I and the Q signal differs from 90°, so that always orthogonality between the I and Q signals is maintained over the complete frequency bandwidth during the operation of the high frequency oscillator.

Figure 5:
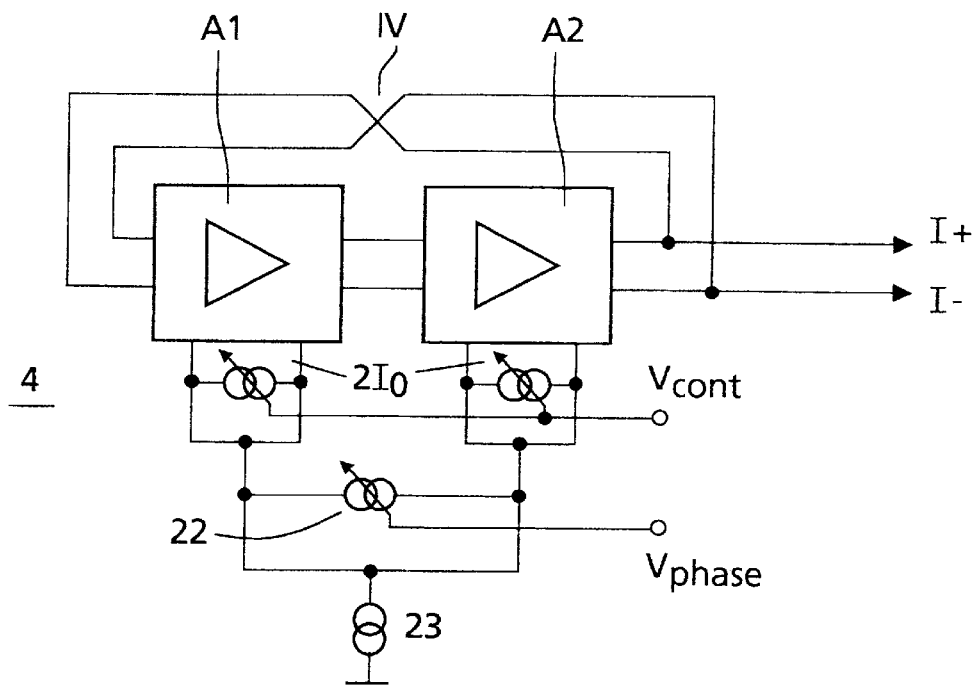
FIG. 5 the delay cell oscillator according to FIG. 3 comprising a arrangement for phase and frequency control.

The phase control signal $V_{phase}$ is coupled to the delay cell amplifiers A1 and A2 of the ring oscillator 4, as shown in FIG. 5. The delay cell amplifiers A1 and A2 are coupled in series, and provide each a phase shift of 90°. The outputs of the delay cells A1, A2 are ground-free, and the output of the delay cell A2 is used for the I+ and the I− signal, and the output of the delay cell A1 is used for the Q+ and the Q− signal, see also FIG. 3. The output of the delay cell A2 is coupled via an inversion IV to the input of the delay cell A1, so that the oscillation condition of 360° is fulfilled.

The ring oscillator 4 comprises further an amplifier section $2I_0$ for providing a current of $2I_0$ to each of the delay cells A1 and A2, and to which amplifier section the control signal $V_{cont}$ of the charge pump 2 is coupled, for providing the frequency control. The amplifier sections $2I_0$ are identical, so that the delay cells A1 and A2 are tuned symmetrically. The amplifier sections $2I_0$ are coupled to same current source 23.

The control signal of the phase detector 21 is coupled to a controllable current source 22, which is coupled to each of the amplifier sections $2I_0$. Via the current source 22 the control voltage $V_{phase}$ provides an unsymmetry of the curents of the current source 23, via which a discrepancy of the required phase difference of 90° of the I/Q signals is corrected.

Figure 6:
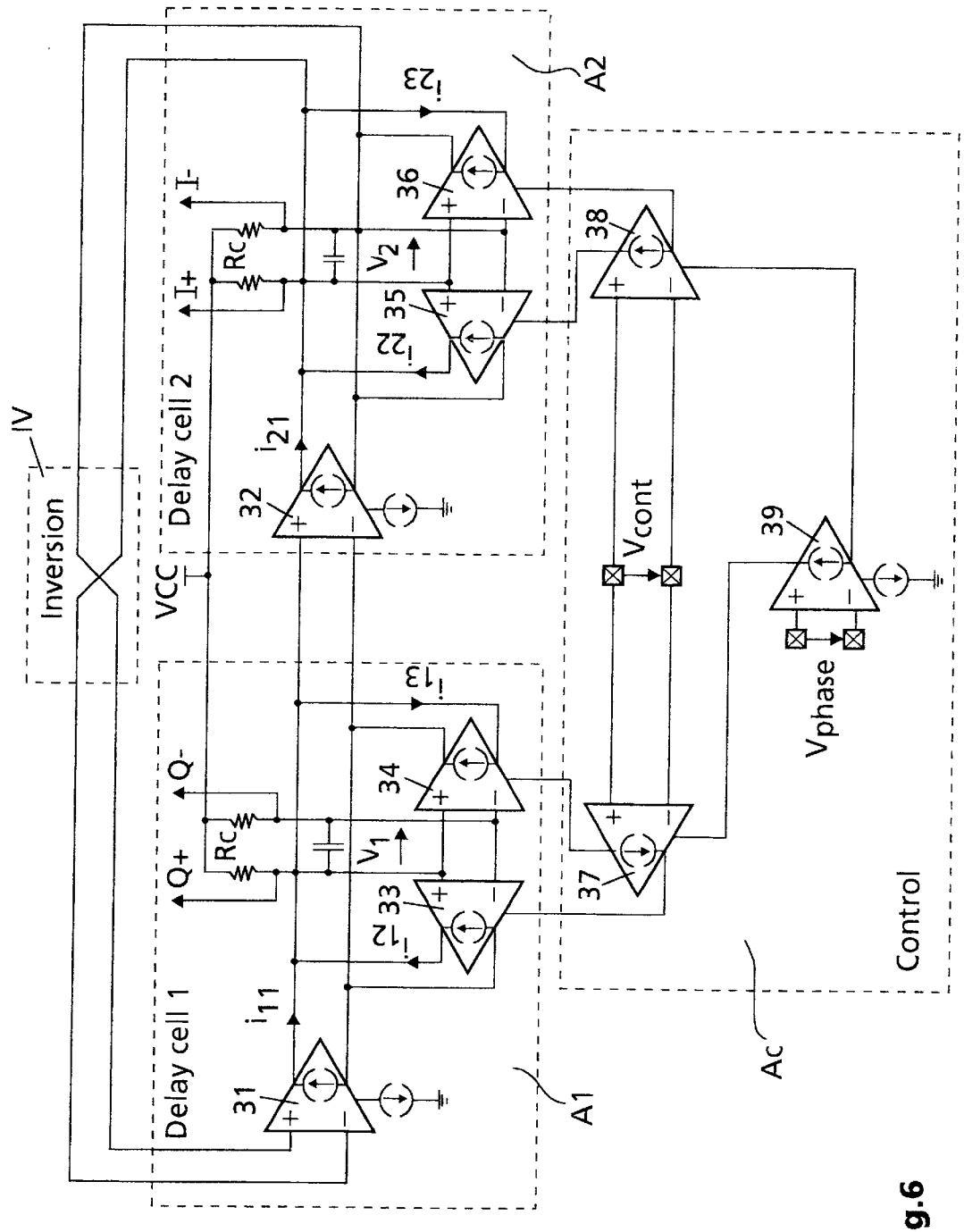
FIG. 6 a circuit diagram of the delay cell oscillator according to FIG. 5.

A detailed circuit diagram of the delay cell oscillator 4 is shown in FIG. 6. The ring oscillator 4 consists essentially of the delay cell amplifiers A1 and A2, the feedback loop with the inversion IV, and the control amplifier Ac for phase and frequency control. The delay cell amplifier 1 comprises an amplifier 31 which is coupled to the inputs of amplifier 32 of the delay cell amplifier A2, and which outputs provide the output signals I+/I− and Q+/Q− via load resistors $R_c$, which are coupled to a supply voltage VCC.

To the outputs of the amplifier 31 two amplifiers 33 and 34 are coupled for the delay and therefore the frequency tuning of the amplifier 31. The delay cell amplifier A2 is set up with amplifiers 32, 35 and 36 in correspondence to the delay cell amplifier A1, for providing a symmetrical delay cell oscillator.

The outputs of the amplifier 37 are coupled to the inputs of the amplifiers 33, 34 for providing a voltage control of the signals Q+, Q−, and are coupled to the outputs of the amplifiers 33, 34 for providing the delay, respectively the frequency adjustment. The frequency adjustment is provided by amplifier 37 of the control amplifier Ac, to which inputs the control signal $V_{cont}$ is applied, and which outputs are coupled each as a supply voltage to the amplifiers 33 and 34. The amplifiers 35, 36 for the delay cell A2 are set up in the same manner as the amplifiers 33, 34. The control amplifier Ac comprises further an amplifier 38 for the delay cell A2, to which input the control signal $V_{cont}$ is also applied, for a symmetric tuning of the delay cells A1 and A2.

The control amplifier Ac comprises further an amplifier 39, to which the phase control signal $V_{phase}$ is applied at the input side. The outputs of the amplifier 39 are each coupled to amplifiers 37 and 38 for shifting amplifier 37 with respect to amplifier 38, to obtain the correct phase difference of 90° for the output signals I and Q. The delay cell oscillator 4 comprises therefore two symmetrical amplifier sections 33, 34, 37; 35, 36, 38 for frequency control, and an amplifier 39, which provides the phase control and which is coupled to these amplifier sections.

What is claimed is:

1. High frequency oscillator comprising a reference oscillator and a phase locked-loop circuit with
   a phase-frequency detector,
   a ring oscillator, being coupled via a divider to said phase-frequency detector,
   a charge pump, being coupled between said phase-frequency detector and said ring oscillator,
   said reference oscillator being coupled to said phase-frequency detector for frequency control,
   said ring oscillator being a symmetrical delay cell oscillator comprising two delay cell amplifiers, wherein said charge pump comprises a current source with two pnp-transistors and a common current source, both being coupled to a differential amplifier, and the current of said current source is controlled by a reference voltage to provide in each of said pnp-transistors half of the current of said common current source.

2. High frequency oscillator according to claim 1, wherein said reference oscillator is a Colpitts type oscillator with a tank circuit, said reference oscillator and said phase locked-loop circuit being integrated within an integrated circuit and said tank circuit being external to said integrated circuit.

3. High frequency oscillator according to claim 1, wherein the tuning range of said reference oscillator is 1.25–1.5 GHz, and the dividing factor of said divider is four for providing a tuned output range of 5–6 GHz.

4. High frequency oscillator according to claim 1, wherein said two delay cell amplifiers comprise a dual output stage for providing ground-free I/Q output signal generation.

5. High frequency oscillator comprising a reference oscillator and a phase locked-loop circuit with
   a phase-frequency detector,
   a ring oscillator for providing I− and Q− output signals, which is coupled via a divider to said phase frequency detector, a charge pump, being coupled between said phase-frequency detector and said ring oscillator for providing a control signal for said ring oscillator, said ring oscillator being coupled to said phase-frequency detector for frequency control,
   said ring oscillator being a symmetrical delay cell oscillator with two delay cell amplifiers, which are driven by an amplifier section, to which said control signal from said charge pump is coupled for frequency control, said amplifier section providing a current to each of said delay cell amplifiers, said high frequency oscillator further comprising a second loop with a second phase detector, which is coupled to said I– and Q– output signals of said ring oscillator for providing a phase control for said I– and Q– output signals, said ring oscillator comprising further a controlled current source for a phase control, which is coupled to said amplifier section, and said second phase detector providing an output signal to said amplifier section for controlling the phase difference of said I– and Q– signals.

* * * * *